United States Patent [19]

Nohara et al.

[11] 4,171,049

[45] Oct. 16, 1979

[54] MAGAZINE AND A METHOD OF STORING ELECTRONIC COMPONENTS

[75] Inventors: Yasumoto Nohara, Hamura; Yukio Harada, Hachiouji; Morio Toyooka, Musashimurayama; Takashi Harada, Higashimurayama, all of Japan

[73] Assignee: Hitachi, Ltd., Japan

[21] Appl. No.: 736,096

[22] Filed: Oct. 27, 1976

[30] Foreign Application Priority Data

Oct. 29, 1975 [JP] Japan .................. 50-129212

[51] Int. Cl.$^2$ .................. H05F 3/02; B65D 85/30
[52] U.S. Cl. .................. 206/328; 206/334; 361/220
[58] Field of Search .............. 206/328, 334, 331, 332, 206/345, 315, 561, 419, 820, 380, 45.34; 220/22, 345; 229/9, 19; 361/220, 212; 174/35 R, 50

[56] References Cited

U.S. PATENT DOCUMENTS

| | | | |
|---|---|---|---|
| 2,723,484 | 11/1955 | Nelson, Jr. | 206/315 |
| 2,817,434 | 12/1957 | Schmetz et al. | 206/380 |
| 3,049,224 | 8/1962 | Fredette et al. | 220/345 |
| 3,180,697 | 4/1965 | Mulch | 220/345 |
| 3,184,056 | 5/1965 | Kisor | 206/331 |
| 3,325,000 | 6/1967 | Edwards | 206/45.34 |
| 3,412,846 | 11/1968 | Spadaro | 220/22 |
| 3,435,949 | 4/1969 | Suverkropp | 206/332 |
| 3,761,861 | 9/1973 | Bailey | 206/328 |
| 3,784,957 | 1/1974 | Bailey | 206/331 |
| 4,037,267 | 7/1977 | Kisor | 206/331 |

Primary Examiner—William T. Dixson, Jr.
Attorney, Agent, or Firm—Craig and Antonelli

[57] ABSTRACT

A magazine for storing electronic components comprising a magazine body and a cover, said magazine body having a plurality of longitudinal receiving grooves formed in parallel with one another on its upside, one end of each of said receiving grooves being open and the other end thereof being closed to prevent the received electronic components from falling out of the magazine, said cover being adapted to overspread the open end of the grooves and the upside of said magazine.

14 Claims, 6 Drawing Figures

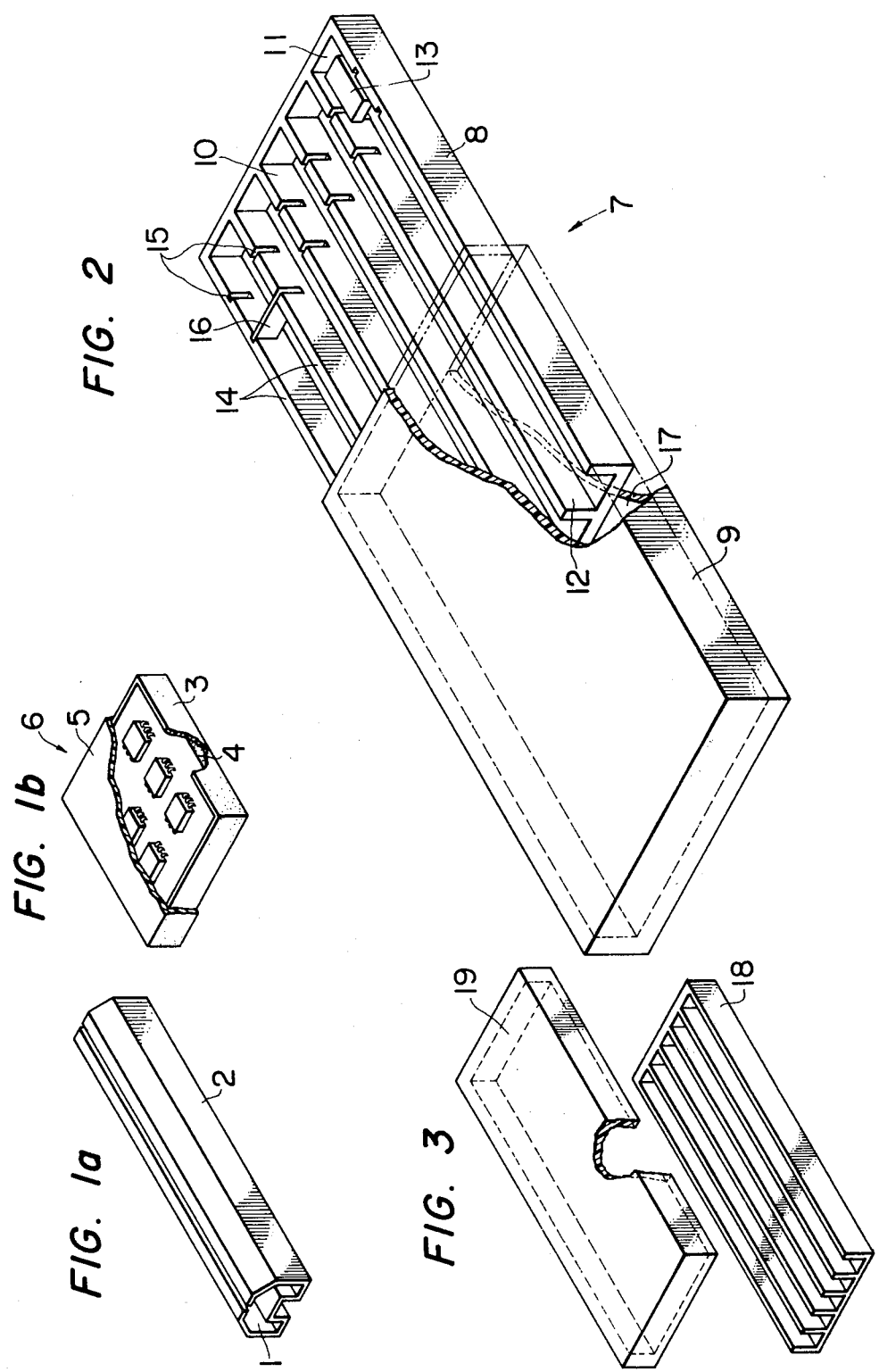

MAGAZINE AND A METHOD OF STORING ELECTRONIC COMPONENTS

BACKGROUND OF THE INVENTION

1. Field of the Invention

This invention relates to a magazine, and more particularly, to a magazine for receiving and holding therein electronic components of a semiconductor device, for example.

2. Description of the Prior Art

The transportation management of electronic components of, for example, a semiconductor device has heretofore been carried out under a procedure in which a plurality of electronic components are carried in a magazine, such as a straight magazine 2 having a substantially C-shaped space 1 in section, as shown in FIG. 1a, or a box-shaped magazine 6 in which a sponge sheet 4 is disposed on the bottom of a box 3 and a lid 5 is provided thereon, as shown in FIG. 1b.

With the known magazines, in order to prevent the semiconductor device carried therein from undergoing electrostatic breakdown due to electrification by static charges, etc., the whole structure is formed of an electric conductor, such an aluminum, in the case of the straight magazine, and an electrically-conductive sponge sheet is used in the box-shaped magazine. Thus, with such constructions, protuberant leads of the semiconductor device are short-circuited and thereby protected.

The straight magazine, however, is heavy since it is wholly formed of aluminum. In case of a large number of such magazines, the weight is massive and the handling thereof is consequently very difficult. Besides, the cost of the magazine is high. On the other hand, with the box-shaped magazine, whenever the electronic components are taken in or out, the lid must be opened and shut. Besides, since the electronic components need to be individually thrust into the electrically-conductive sponge sheet at the time of storage, automatic storage of such products is difficult, and the working property of the magazine is very undesirable.

SUMMARY OF THE INVENTION

It is accordingly an object of this invention to provide a magazine with which products can be simply taken in and out and which is adapted for automation.

Another object of this invention is to provide a magazine which is light in weight and low in cost.

Still another object of this invention is to provide a magazine with which a product or an electronic component does not undergo electrostatic breakdown.

This invention for accomplishing such objects consists of a magazine comprising a magazine body and a cover, said magazine having a plurality of receiving grooves formed in parallel with one another on its upside, one end of each of said receiving grooves being formed in an open state and the other end thereof being formed in a closed state so as to prevent a received article from falling off the end, said cover being formed so as to overspread the open end and said upside of said magazine. The invention is directed also to a method of storing electronic components using the magazine.

BRIEF DESCRIPTION OF THE DRAWING

FIGS. 1a and 1b are perspective views each showing a prior art magazine for storing electronic components therein;

FIG. 2 is a perspective view of a magazine according to an embodiment of this invention;

FIG. 3 is a perspective view of a magazine according to another embodiment of this invention.

PREFERRED EMBODIMENTS OF THE INVENTION

Figure 4A:
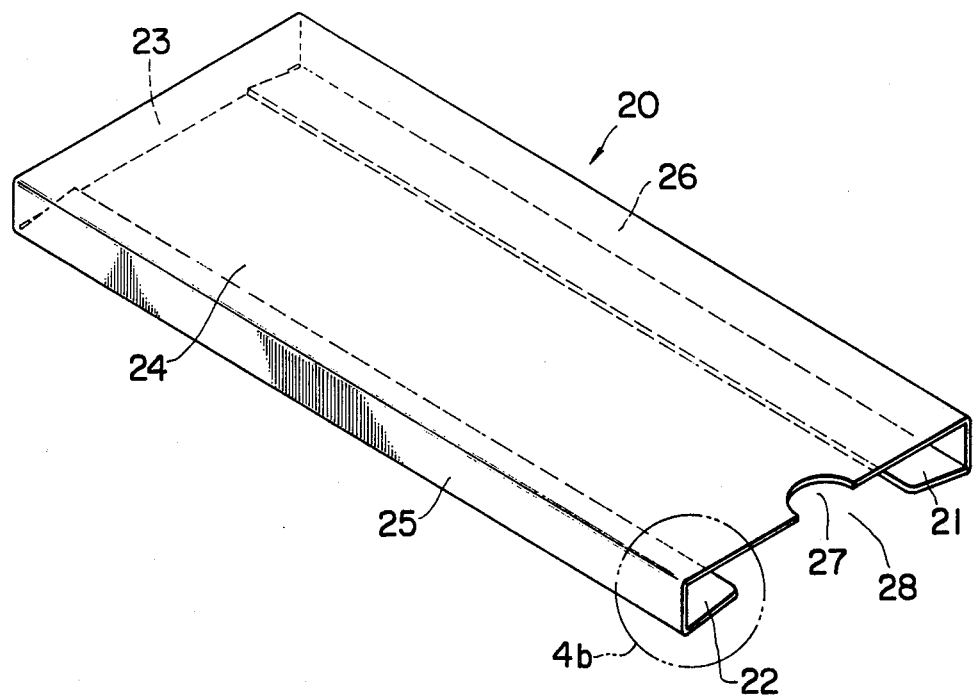
FIGS. 4a and 4b show a cover of a magazine according to still another embodiment of this invention.

FIG. 2 illustrates an embodiment of the magazine according to this invention. As shown in the figure, the magazine 7 consists of a magazine body 8 and a cover 9. Five grooves 10 are formed on the upside of the magazine body 8 extending along the lengthwise direction thereof. One end of the grooves 10 is closed by a vertical frame wall 11, whereas the other end is open at the end face of the magazine body 8. Accordingly, an electronic component 13 can be automatically inserted (caused to flow in a stream of components) into the groove 10 through the open end 12 from, for example, an auto-handler or a printer. It is also possible to attach the magazine to the auto-handler or printer and to load it with the electronic components through the open ends 12 in succession. Further, it is possible to place the electronic component 13 into the groove 10 from above.

In order to enable one to adjust the lengths of the grooves 10 in the magazine body 8, division notches 15 are provided in partition walls 14 on both sides of each groove 10 near the end thereof remote from the open end 12. For the sake of convenience, each partition wall is illustrated as having two division notches 15 in FIG. 2. A division plate 16 is fitted into a pair of division notches 15 of the partition walls 14 on the respective sides of one groove 10. In this way, the length of the groove 10 can be adjusted. Accordingly, it is also possible to adjust the positions of the division plates 16 so that the same number of electronic components 13 may always be received in each groove 10, for example, ten components may be accommodated in each groove, so as to facilitate counting. In this case, the storage of a predetermined number of received articles is accomplished by admitting the articles into the groove 10 until the groove becomes filled.

The magazine body 8 is made of an electrically-conductive resin whose electric resistance value is $10^3$—$10^4$ ohm. On the other hand, the cover 9 is made of a transparent resin. The cover 9 is provided with sidewalls 17 along three edges of the cover 9 so that one end face thereof is open. The whole magazine body 8 is encompassed within the hollow formed by the cover. The magazine body 8 can be put in and taken out only through the one open end face of the cover 9.

With the magazine 7 of such structure, after the magazine body 8 is separated from the cover 9, the electronic components are introduced therein or taken out. The introduction or taking-out is most efficient when performed through the open ends 12 of the grooves 10. That is, the electronic component 13 is introduced or taken out by sliding it along the groove 10. As a result, the magazine 7 can be directly used as a magazine for automatic supply (a loader) or carrying out (an unloader) in a variety of jobs in, for example, the assembly test process of electronic components.

With the magazine, when the cover is moved so as to glide relative to the magazine proper, it can be simply attached or detached and is difficult to come off. If necessary, a fixture may be provided on one side or frame wall side so as to prevent the magazine body and the cover from accidentally separating.

Since the magazine body is made of an electrically-conductive resin, the lead terminals of the electronic component placed thereon are short-circuited, and therefore, electrostatic breakdown of the product does not occur. In addition, since the cover of the magazine is transparent, the produce in the interior can be visually confirmed conveniently, and, since the magazine is formed of a resin, it is lighter in weight and lower in cost than the aluminum magazine provided in the prior art.

Further, with the magazine of this invention, a desired number of different types of products (electronic components) of different sizes and shapes can be stored by adjusting the division plates. In particular, when the number of stored devices per groove is in the order of several tens of components, the management of the products is facilitated.

This invention is not restricted to the foregoing embodiment. For example, as shown in FIG. 3, a cover 19 may be so constructed as to be put on a magazine body 18 from above.

Figure 4B:
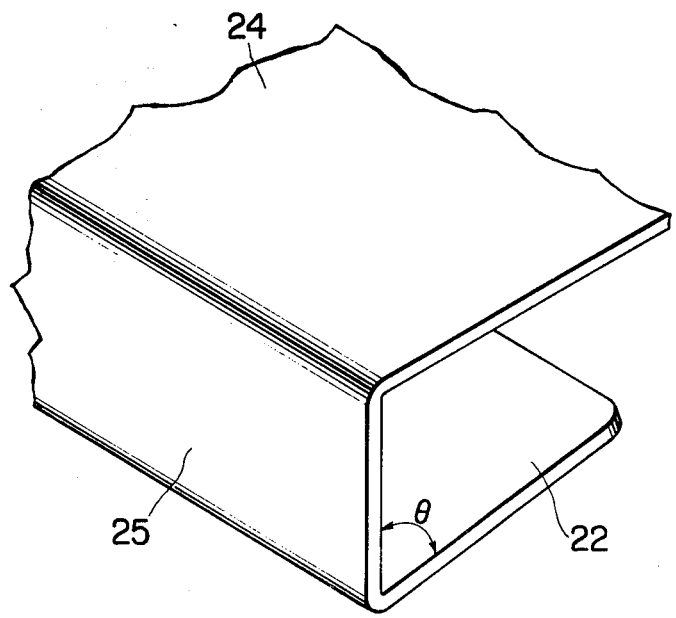

FIGS. 4a and 4b show another embodiment of the cover for use in this invention. FIG. 4a is a perspective view of the cover. The cover 20 is formed of polyvinyl chloride and has a thickness of about 0.5 mm. The entire surface of the cover 20 is coated with an antistatic agent, for example, "Elecdan FFC Super" (tradename, produced by Nippon Engineering Service, Inc., in Japan). Numerals 21 and 22 designate supporting wings which support the underside of the magazine body. Numeral 23 designates an end plate which closes the open end of the magazine proper. Shown at 24 is an upper plate which closes the upside of the magazine body. The upper plate 24 is provided with a semi-circular cut-away portion 27 adjacent the open end side 28, and the magazine body can be drawn out from the cover easily by utilizing the cut-away portion. Numerals 25 and 26 denote side plates. The magazine body is attached to or detached from the cover by utilizing the open end 28.

FIG. 4b is an enlarged view of the part of the cover indicated at 4b in FIG. 4a. As apparent from FIG. 4b, an angle θ which is defined by the supporting wing 22 and the side plate 25 is formed at an acute angle. This serves to facilitate the close contact between the upside of the magazine body and the upper plate 24 of the cover when the magazine body is inserted in the cover.

As set forth above, according to the magazine of this invention, the products can be simply and continuously put in and taken out. Therefore, not only the working property is enhanced, but also the magazine is suitable for automation.

According to the magazine of this invention, resin which is inexpensive and light as compared with aluminum, etc., is used. Therefore, a magazine capable of easy handling can be obtained. Since, in the magazine of this invention, the magazine body is formed of the electrically-conductive material, electrostatic breakdown of the products also does not arise.

Further, according to the magazine of this invention, the number of stored components in each magazine can be adjusted, so that the management of the products is easy.

While we have shown and described several embodiments in accordance with the present invention, it is understood that the same is not limited thereto but is susceptible of numerous changes and modifications as known to a person skilled in the art, and we, therefore, do not wish to be limited to the details shown and described herein but intend to cover all such changes and modifications as are obvious to one of ordinary skill in the art.

What is claimed is:

1. A magazine for storing electrical components comprising a magazine body and a cover, said magazine body being formed of electrically-conductive resin and having a plurality of upstanding partition walls defining a plurality of receiving grooves which are upwardly open along substantially their entire length and provided in parallel with one another on an open upper side thereof, said grooves being open at one end thereof so as to provide an unobstructed opening through which said electronic components can be inserted and the other end of said grooves being closed by an end wall to prevent movement of an electrical component received in a groove from passing out said other end, said cover being formed with wall means overlying said open end of said grooves and said upper side of said body.

2. The magazine according to claim 1, said partition walls being formed with division notches aligned in planes transverse to said grooves, and at least one partition plate detachably attached to said magazine body by engagement in said division notches.

3. The magazine according to claim 1, wherein said cover is formed of a transparent resin and has its entire surface coated with an antistatic agent.

4. A magazine according to claim 1, wherein said cover comprises an upper plate having a pair of transverse sidewalls and a single transverse end wall extending from three sides thereof so that one end of said cover corresponding to the end of said magazine body at which the closed end of said grooves are located is open.

5. The magazine according to claim 4, wherein said cover is formed of a transparent resin and has its entire surface coated with an antistatic agent, and said upper plate of said cover is formed with a cut-away portion on the open end side thereof.

6. The magazine according to claim 5, wherein supporting wings which have a predetermined width extend from both of the sidewalls of said cover on an underside thereof, said side plates and said supporting wings being relatively disposed to define an acute angle.

7. A method of storing electronic components comprising the steps of sequentially sliding the electronic components from one open end towards the other closed end of each of a plurality of receiving grooves formed in parallel with one another by a plurality of upstanding partitions on an open upper side of a magazine body formed of electrically-conductive resin, thereby to insert said electronic components in said magazine body, and subsequently attaching a cover to said magazine body in which said electronic components are received with wall means of said cover overlying said open upper side and the open end of said magazine body.

8. A method according to claim 7, wherein said electronic components have a plurality of external leads and said step of sliding the electronic components into said case is performed while sliding the leads of each component on an inner wall surface of the receiving groove.

9. A method of storing electronic components comprising the steps of sequentially sliding the electronic components from one open end towards the other closed end of each of a plurality of receiving grooves formed in parallel with one another on an open upper side of a magazine body formed of electrically-conductive resin, thereby to insert said eletronic components in said magazine body, and subsequently inserting into a cover said magazine body in which said electronic components are received, said cover being made of a transparent resin and having a receiving hole which is open at one end and closed at the other end and which is adapted to overlie said open upper side of said magazine body, the open end side of said magazine body being slid into the open end side of said receiving hole towards the closed other end thereof during said inserting step.

10. A method according to claim 9, wherein said electronic components have a plurality of external leads and said step of sliding the electronic components into said case is performed while sliding the leads of each component on an inner wall surface of the receiving groove.

11. A case for storing an electric component having therein an inner space for receiving the whole body of said electric component and being formed of electrically conductive resin.

12. A method for storing electric components each having a plurality of outer leads in a case comprising the step of inserting said electric components from one open end towards the other end in the case while sliding the leads of each electric component on the inner surface of said case, said case being formed of electrically conductive resin.

13. The combination comprising a case and a plurality of electric components each having a plurality of outer leads, said case being formed of electrically conductive resin and having a substantially flat inner surface at the bottom thereof, wherein said electric components are enclosed within said case with the leads of said electric components in contact with said inner surface of said case.

14. The combination according to claim 13, wherein said case comprises a body and a cover, said body being formed of electrically-conductive resin and having a plurality of upstanding partition walls defining a plurality of receiving grooves which are upwardly open along substantially their entire length and provided in parallel with one another on an open upper side thereof, said grooves being open at one end thereof so as to provide an unobstructed opening through which said electronic components can be inserted and the other end of said grooves being closed by an end wall to prevent movement of an electrical component received in a groove from passing out said other end, said cover being formed with wall means overlying said open end to said grooves and said upper side of said body.

* * * * *